United States Patent [19]

Fu et al.

[11] 4,305,200

[45] Dec. 15, 1981

[54] METHOD OF FORMING SELF-REGISTERING SOURCE, DRAIN, AND GATE CONTACTS FOR FET TRANSISTOR STRUCTURES

[75] Inventors: Horng-Sen Fu, Sunnyvale; John L. Moll; Juliana Manoliu, both of Palo Alto, all of Calif.

[73] Assignee: Hewlett-Packard Company, Palo Alto, Calif.

[21] Appl. No.: 91,845

[22] Filed: Nov. 6, 1979

[51] Int. Cl.³ .......................................... H01L 21/283
[52] U.S. Cl. ..................................... 29/571; 357/23; 357/41; 357/59; 427/82; 427/93
[58] Field of Search ................. 29/571, 589, 590, 591; 156/657; 357/23, 41, 59; 427/82, 93

[56] References Cited

U.S. PATENT DOCUMENTS 4,080,719  3/1978  Wilting ................................ 29/571
4,136,434  1/1979  Thibault et al. .................... 29/571
4,181,537  1/1980  Ichinohe ............................ 148/1.5

Primary Examiner—Aaron Weisstuch
Attorney, Agent, or Firm—Ronald E. Grubman; Edward Y. Wong

[57] ABSTRACT

The present invention provides a silicon gate FET and associated integrated circuit structure in which a second level of polysilicon is selectively oxidized to provide insulating regions where desired. Regions of the polysilicon which were not oxidized are suitably doped to function as electrical interconnects to the source and drain regions in the substrate and to the gate. In the preferred embodiment, a metallic interconnection is made between the gate and drain or source region with the second level of polysilicon.

4 Claims, 6 Drawing Figures

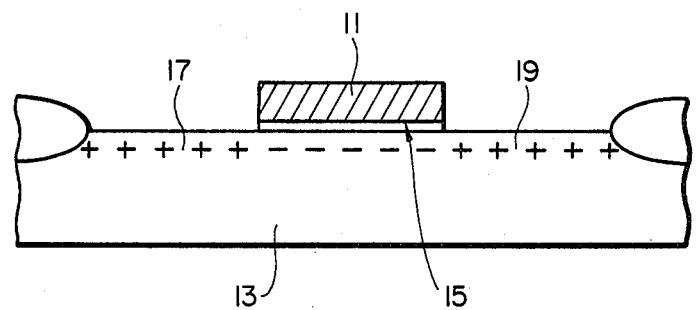
FIG_1
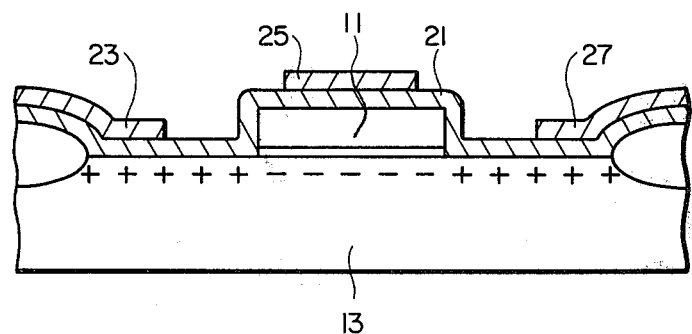
FIG_2
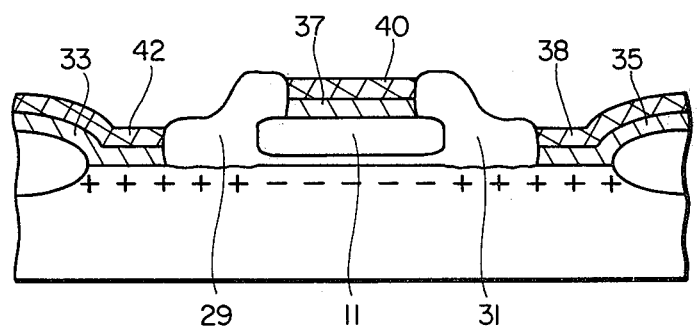
FIG_3

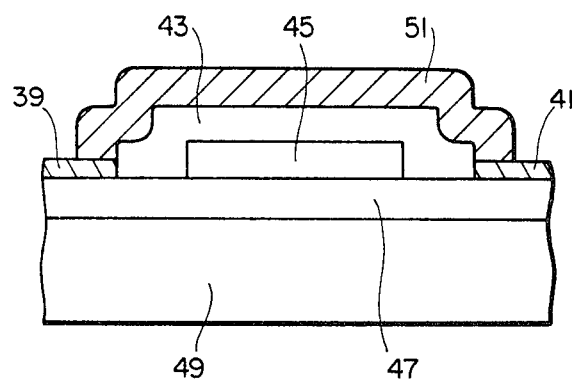
FIG_4
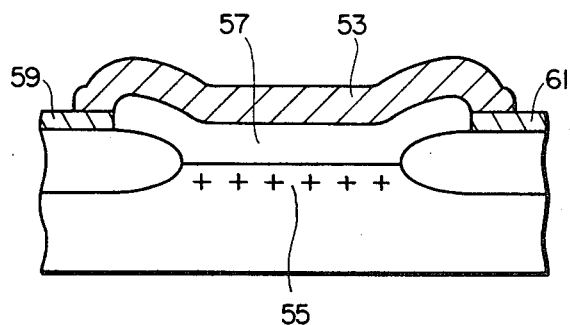
FIG_5
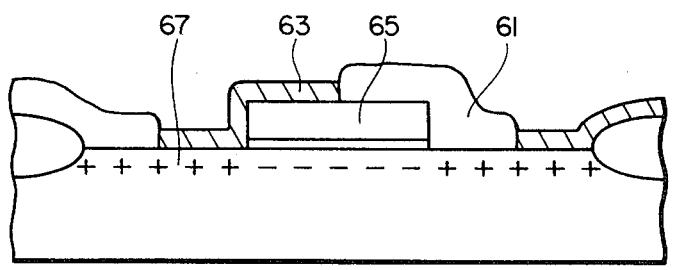
FIG_6

METHOD OF FORMING SELF-REGISTERING SOURCE, DRAIN, AND GATE CONTACTS FOR FET TRANSISTOR STRUCTURES

BACKGROUND OF THE INVENTION

In the manufacture of MOS-type semiconductor structures, particularly those having small geometries associated with integrated circuits (IC's), the problem of making electrical contact to the source, drain, and gate of the device has been a difficult one. In the prior art, it is known to form an oxide layer over the source, drain, and gate regions to which connection is to be made, followed by masking and etching away of the oxide in the regions in which contact is to be made. Metal is then deposited onto the underlying source, drain, and gate regions exposed by the etching to serve as an electrical interconnect to those regions. In the prior art, it is conventional to accomplish the etching step by wet chemical etching or plasma etching. However, it has been found that the wet chemical etching resulted in severe undercutting, producing oversized contact windows, which make it difficult to achieve minimum contact size. Additionally, the undercutting increases the probability of source-drain shorting to the gate electrode. Plasma etching, too, exhibits a number of difficulties including a slow etching rate for $SiO_2$, an insufficient etch rate difference between $SiO_2$ and underlying silicon, and the production of extremely steep walls in the etched oxide. Subsequent metal overlays display serious metal step-coverage problems.

Another approach is discussed by V. L. Rideout in a paper entitled, "Polysilicon-Gate Field-Effect Transistors with Self-Registering Metal Contacts to both Polysilicon and Diffused Silicon Regions", *IBM Technical Disclosure Bulletin*, Volume 21, No. 9, Feb. 1979. In this reference there is taught a method for fabricating field-effect transistors in which several nitride and oxide layers are utilized in the processing to achieve self-registering metal contacts to both the diffused regions in the substrate and to polysilicon gates at the surface of the device.

SUMMARY OF THE INVENTION

In accordance with the illustrated preferred embodiments, the present invention provides a silicon gate FET and associated integrated circuit structure in which a second level of polysilicon is selectively oxidized to provide insulating regions where desired. Regions of the polysilicon which were not oxidized are suitably doped to function as conducting contacts to the source and drain regions in the substrate, and to the gate. In some preferred embodiments, the insulating regions created by the selective oxidation of the polysilicon layer may cover any or all of the source, drain, and gate, so that metallic crossing interconnects can be made over these elements.

DESCRIPTION OF THE DRAWINGS

FIG. 1 shows a cross-section of a partially completed silicon-gate FET.

FIG. 2 shows the FET after a further fabrication step in which a second polysilicon layer is deposited and overlayed by a selective pattern of nitride elements.

FIG. 3 shows the FET with selected portions of the second polysilicon layer having been oxidized to form insulating regions, the remaining polysilicon regions having been doped to form electrical interconnects.

FIG. 4 shows an oxidized region of the polysilicon layer insulating the gate from a metallic crossing interconnects.

FIG. 5 shows the oxidized region of the polysilicon layer insulating a source or drain region from a metallic crossing interconnect.

FIG. 6 shows an FET structure in which the second polysilicon layer has been oxidized and doped to form an electrical short between gate and source (drain).

DETAILED DESCRIPTION OF THE INVENTION

In FIG. 1, there is shown a partially completed structure of an FET having a polysilicon gate 11 formed from a first polysilicon layer. Gate 11 is separated from a substrate 13, e.g., a p-type silicon substrate, by an insulating region 15, for example, of silicon dioxide ($SiO_2$). Regions 17 and 19 have been doped, for example, by an arsenic implant to be $n^+$-type regions which will serve as the source and drain regions of the transistor. All of the processing steps leading to the configuration shown in FIG. 1 are conventional in the prior art. In FIG. 2, the transistor is shown having a second polysilicon layer 21 deposited atop substrate 13 and polysilicon gate 11. On polysilicon layer 21 is deposited a nitride layer (e.g., $Si_3N_4$, or a layer of $Si_3N_4$ on a thin $SiO_2$ layer, the latter configuration being preferred if the layer is to be plasma etched) which has been masked and etched to leave on the device limited nitride regions such as those indicated in FIG. 2 as regions 23, 25, and 27.

At this stage of the fabrication, a low temperature oxidation step is performed to oxidize polysilicon layer 21 in those regions not protected by nitride. The oxidation of the polysilicon layer may be performed by the application of steam at temperatures preferably less than 900° C. at atmospheric pressure; by high pressure ($>1$ atm.) dry $O_2$; or by high pressure ($>1$ atm.) steam. To insure complete oxidation of polysilicon 21 at the corners over gate 11, an over-oxidation of about fifty percent (50%) is preferred.

Subsequent to the oxidation step, nitride regions 23, 25, and 27 are removed by conventional etching techniques such as wet chemicals or dry plasma etch, leaving a structure such as that shown in FIG. 3. Regions 29 and 31 have been oxidized to form $SiO_2$ insulating regions surrounding gate 11. Polysilicon regions 33, 35, and 37 which were protected from oxidation by nitride regions 23, 25, and 27 (FIG. 2) are not oxidized. These regions are now doped to form electrically conducting regions, e.g., using a dopant of either phosphorus or arsenic to a concentration of about $1 \times 10^{19}$ atoms/cm$^3$ to $1 \times 10^{21}$ atoms/cm$^3$. It should be noted that the doping of the polysilicon could have been performed alternatively prior to the deposition of the nitride layer on the second polysilicon layer.

It can now be seen from FIG. 3 that electrical contact has been made to the source, drain, and gate regions via doped polysilicon regions 33, 35, and 37, respectively, without the necessity of masking and etching through the insulating layer on the substrate and gate. In fact, the present invention does not require the introduction of any additional masking levels, as compared to conventional four-masking level techniques.

In some preferred embodiments, electrical resistance can be reduced by forming a silicide, such as platinum silicide (PtSi), on doped polysilicon regions 33, 35, and 37, these PtSi regions being labeled 38, 40, and 42 in FIG. 3. It should be noted that the formation of PtSi reduces the thickness of the underlying polysilicon layer, which may be partially or even completely converted into PtSi. The formation of silicide is accomplished by first removing any residual oxide on the polysilicon regions, and then sputtering a thin layer of platinum on the surface, typically 500–1000 Å of $P_t$. The structure is then alloyed in a mixture of $N_2$ and $H_2$ ambient at about 500° C. for about twenty minutes. This alloying is followed by an aqua regia etch to remove any non-reacted platinum from the surface. An advantage of this embodiment of the invention is that the silicide formation can be accomplished without any additional masking operations.

In an alternative embodiment, layer 21 may itself be a silicide, preferably of a refractory metal, such as tungsten silicide or molybdenum silicide, which can be selectively oxidized to form insulating and conducting regions. In this case, it is not necessary to form a conducting silicide by applying platinum, as described above. Also, if desired, gate 11 may be of a similar silicide, or, alternatively, of a metal, in lieu of the polysilicon discussed above.

In the manufacture of integrated circuits (IC's) it is often necessary or desirable that metallic interconnects be formed which cross over source, drain, or gate regions. In accordance with the principles of the present invention, these metal crossings can be effected by exploiting the oxidation of the second polysilicon level to form insulating regions separating the metal crossing elements from the underlying source, drain, or gate regions. Thus, in FIG. 4, there are shown two elements 39 and 41 of polysilicon remaining from the second polysilicon layer which has been selectively oxidized to form an $SiO_2$ region 43. Region 47 is an insulating region separating the substrate 49 from the gates and interconnects. Insulating region 43 completely covers a portion 45 of the underlying first polysilicon level which is desired to be crossed. A metallic interconnect 51 may now be formed crossing over polysilicon region 45, and being insulated therefrom by $SiO_2$ region 43.

FIG. 5 shows a similar metallic interconnection 53 insulated from a source or drain region 55 by an insulating region 57. Insulating region 57 is again formed in accordance with the invention by oxidizing the second polysilicon layer of the device. Two electrical conducting regions 59 and 61 are shown as being connected by interconnect 53.

In certain circuits, it is desired to make an electrical short between the gate and source (or drain) of certain transistors in the circuit, e.g., depletion mode transistors. In the context of the present invention, this can be accomplished very simply and without introducing additional area requirements to the device, by simply not oxidizing the second polysilicon layer between the gate and source (or drain). Thus, in FIG. 6, a region 61 of a second polysilicon layer has been oxidized, but another region 63 has been left unoxidized and rendered conducting. Region 63, therefore, provides an electrical short between gate 65 and source (or drain) region 67 in the substrate.

We claim:

1. A method of manufacturing a semiconductor device having a semiconductor substrate, a gate on said substrate, and drain and source regions in said substrate, said method comprising the steps of:
    depositing a silicon containing layer on said substrate over said regions and on said gate;
    depositing a protective layer on said silicon containing layer;
    selectively etching said protective layer to expose predetermined regions of said silicon containing layer, leaving at least a region between said gate and one of said source and drain regions unexposed;
    oxidizing said exposed regions of said silicon containing layer to convert said exposed regions to electrically insulating regions;
    removing the remaining portions of said protective layer; and
    doping said unexposed regions of said silicon containing layer to convert said unexposed regions to electrically conducting regions, thereby effectuating an electrical short between said gate and one of said source and drain regions.

2. The method as in claim 1, wherein said silicon containing layer is polysilicon.

3. The method as in claim 1, wherein said silicon containing layer is metal silicide.

4. The method as in claim 3, wherein said metal silicide is a refractory metal silicide.

* * * * *